United States Patent [19]

Brokaw

[11] 4,363,024
[45] Dec. 7, 1982

[54] DIGITAL-TO-ANALOG CONVERTER PROVIDING MULTIPLICATIVE AND LINEAR FUNCTIONS

[76] Inventor: Adrian P. Brokaw, 81 Macon Rd., Burlington, Mass. 01803

[21] Appl. No.: 853,211

[22] Filed: Nov. 21, 1977

[51] Int. Cl.³ .......................................... H03K 13/02
[52] U.S. Cl. .................... 340/347 AD; 340/347 DA; 340/347 M; 375/26
[58] Field of Search ... 340/347 M, 347 AD, 347 DA; 332/11 D; 179/15 AV; 375/26

[56] References Cited

U.S. PATENT DOCUMENTS

| | | | |
|---|---|---|---|
| 2,889,409 | 6/1959 | Carbrey | 340/347 M X |
| 3,541,354 | 11/1970 | Basham | 340/347 DA |
| 3,678,504 | 7/1972 | Kaneko | 340/347 DA |
| 3,705,359 | 12/1972 | Kappes | 340/347 AD X |
| 3,882,484 | 5/1975 | Brokaw et al. | 375/34 X |
| 4,020,485 | 4/1977 | Busby | 340/347 DA |
| 4,138,667 | 2/1979 | Vogel | 340/347 DA |
| 4,164,729 | 8/1979 | Simon et al. | 340/347 M X |

OTHER PUBLICATIONS

Terman, Radio Engineers' Handbook, McGraw-Hill Book Co., 1943, pp. 215-217.

*Primary Examiner*—T. J. Sloyan
*Attorney, Agent, or Firm*—Parmelee, Bollinger & Bramblett

[57] ABSTRACT

A digital-to-analog converter operates in accordance with the $\mu 255$ compression law and includes an amplifier, a reference voltage source and a feedback resistor ladder attenuator from the amplifier output to its input. The attenuator is multiplicatively weighted and referenced to the reference voltage. A current source or sink including a linearly weighted resistor ladder is also connected to the amplifier input.

An analog-to-digital converter includes a similar resistor ladder attenuator and resistor ladder current source or sink at the input of a comparator. The attenuator is referenced to a reference potential. The digital signal is determined by logic circuitry responsive to the comparator output in a successive approximation operation.

11 Claims, 4 Drawing Figures

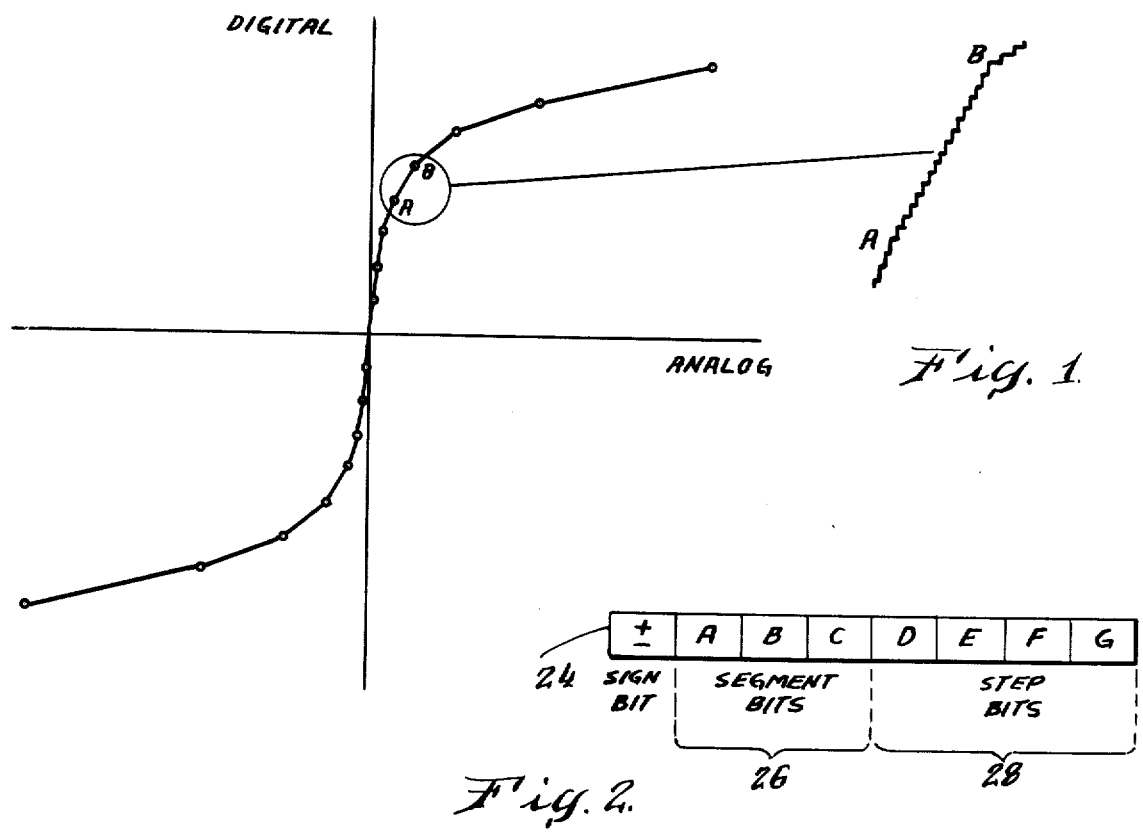
Fig. 1.
Fig. 2.
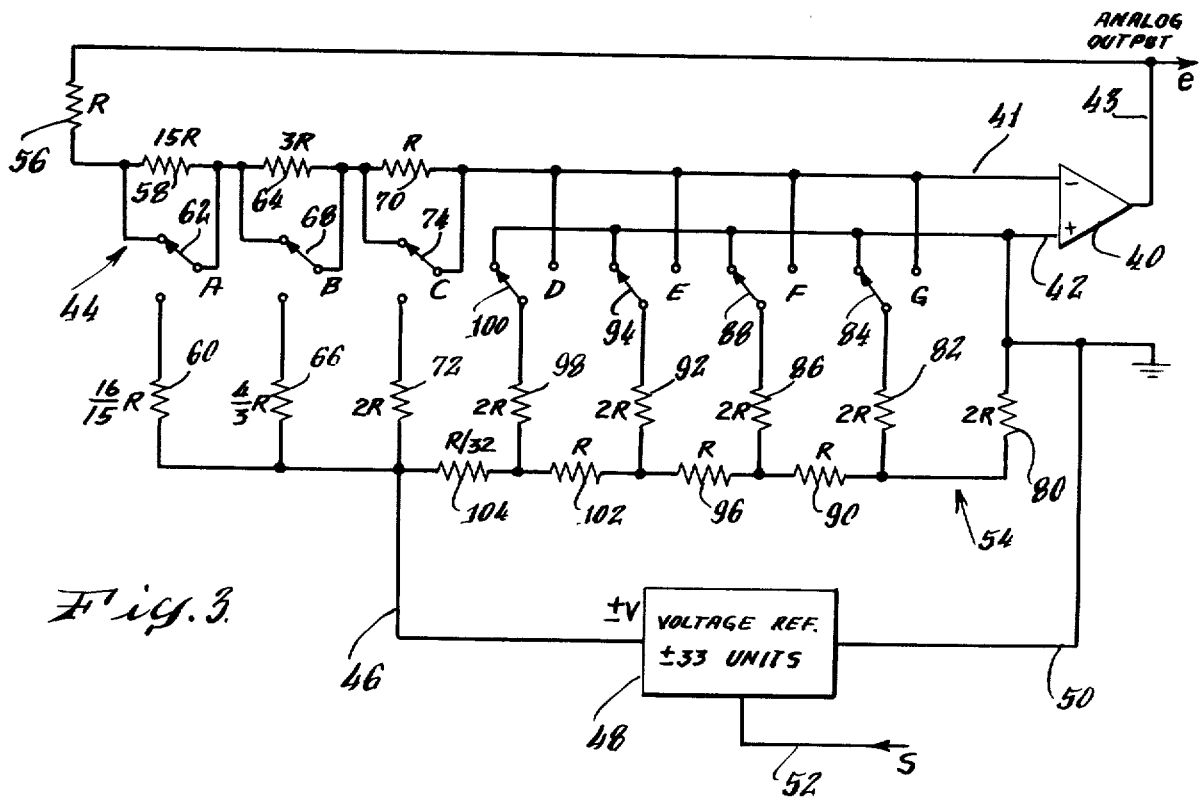
Fig. 3.

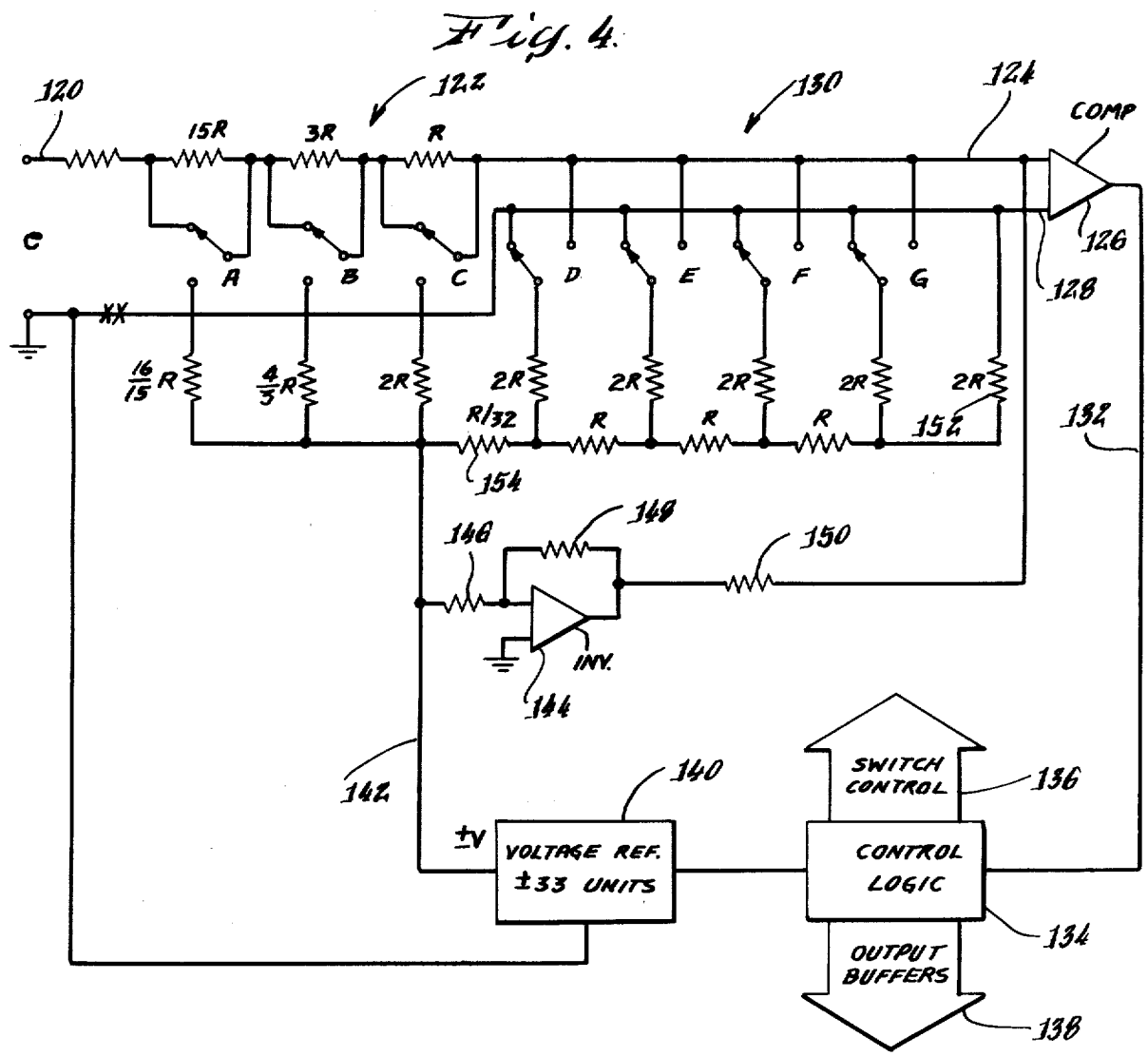

DIGITAL-TO-ANALOG CONVERTER PROVIDING MULTIPLICATIVE AND LINEAR FUNCTIONS

BACKGROUND OF THE INVENTION

This invention relates to digital-to-analog and analog-to-digital converters and more particularly to such converters which operate according to the $\mu 255$ compression law.

For a number of years, voice signals have been transmitted along telephone lines by pulse code modulation (PCM). In PCM, each sample of an analog signal is quantized, that is, it is rounded off to one of a number of predetermined quantum levels, the difference between levels being quantum steps. Each quantum level is associated with a digital code word of several binary bits. Thus, a continuing analog signal may be represented by a series of multiple bit code words.

Because each sample is rounded off to a quantum level, an error in the coded signal known as the quantizing error appears as quantization noise. If the spacing between quantum levels is uniform, that is where the quantum steps are constant, the quantization error will be within a set range independent of the level of the signal; thus, the signal to noise ratio will vary with the level of the signal. A constant step or linear code providing the minimum acceptable signal to noise ratio can be provided by decreasing the spacing between quantum levels; however, this results in less spacing than is required to meet the minimum signal to noise ratio with the higher level signal. Decreased spacing between quantum levels requires an increased number of bits in each code word and it is preferred that the number of bits be minimized.

In order to provide a substantially uniform signal to noise ratio over the entire range of analog signal amplitudes, and thus decrease the number of bits per word while maintaining a minimum signal to noise ratio, nonlinear digital codes have been developed. In these codes, the steps between quantum levels increase at higher quantum levels. Thus the signal error increases with the level of the signal and the ratio of signal to noise remains substantially constant. One such code follows what is known as the $\mu$ compression law. In my prior U.S. Pat. No. 3,882,484 I provided digital-to-analog and analog-to-digital converters which could operate in accordance with the $\mu$ compression law. In that patent, in the digital-to-analog converter, logic circuitry controlled a step attenuator in the feedback circuit of an op-amp. In the analog-to-digital converter the analog signal was applied through a step attenuator to a comparator, and logic circuitry responsive to the comparator output controlled a successive approximation determination of the digital signal.

Although my prior patent discloses a successful encoder/decoder for coding according to the $\mu$ compression law, it does not provide coding and decoding of the more recent $\mu 255$ compression law coding. In that code the analog signal is quantized linearly within segments or groups of steps, that is, the space between quantum levels within each segment remains constant. However, each segment, which includes sixteen steps, is of a different length; the segment lengths and thus the spacing of steps within the segments increases with the signal input. As shown in FIG. 1, the segments between end points 22 approximate a $\mu$ law coding while steps within each segment appear as a simplified linear coding.

Referring to FIG. 2, the $\mu 255$ code word includes a sign bit 24, three segment bits 26, and four step bits 28. The three segment bits define one of eight segments for a plus or minus signal. The quantization levels at the end points of each segment vary nonlinearly with the analog signal. The four step bits define any of sixteen steps within the segment defined by the segment bits. The steps within the segment vary linearly with the four-bit step code; that is, the space between any quantum level within the segment and one of the end points of that segment can be determined by multiplying the value of the four-bit step code word by a first constant and adding a second constant which may be zero.

For a more specific definition of the $\mu 255$ compression law with respect to both coding and decoding reference is made to the CCITT recommendations, Vol. III, recommendations 6.711 at pages 375 and 376. It should be noted that, in encoding, the first segment includes a first interval or step of one unit whereas all others of that segment are of two units. This is because the digital code defines the value between two encoder decision values. By providing a half-step in the encoding process, the value of the first digital code will be at the first quantum level and so on.

Although a number of methods have been developed to realize direct coding and decoding of the $\mu 255$ compression law, most of these methods are complex and require a number of op-amps and high precision analog-to-digital converters.

An object of this invention is to provide circuits for the analog-to-digital and digital-to-analog conversion of signals in accordance with a compression law which results in nonlinearly weighted groups, each group including linearly weighted steps.

It is a more particular object of this invention to provide analog-to-digital and digital-to-analog converters which operate according to the $\mu 255$ compression law.

It is a further object of this invention to provide such converters which are inexpensive and are of relatively simple design yet which provide an accurate conversion as set forth by the CCITT recommendations.

SUMMARY OF THE INVENTION

In accordance with principles of this invention, a digital-to-analog converter comprises an amplifier having a feedback circuit including a resistor ladder attenuator referenced to a reference potential. A current source or sink is also connected to the input of the amplifier and includes a second resistor ladder network. The attenuation of the attenuator and the current level of the current source or sink is varied in accordance with a digital signal to give an analog output from the amplifier.

According to other principles of this invention, a analog-to-digital converter comprises a similar attenuator and current source or sink connected to the input of a comparator. A logic circuit responds to the comparator output to vary the attenuation of the attenuator and the current level of a current source or sink and also to provide a digital output representative of the analog input.

According to other principles of the invention, the digital-to-analog converter is designed to decode a digital signal having bits $X_1, X_2, \ldots$ and $X_m$ and $Y_1, Y_2 \ldots$ and $Y_n$ such that the amplifier has an output voltage in accordance with the equation:

$$e = P(X_1X_2 \ldots X_m)(V + Q(Y_1Y_2 \ldots Y_n)) - V$$

where e is the analog output in arbitrary units, V is a reference voltage, $(X_1X_2 \ldots X_m)$ is the decimal number corresponding to the binary number obtained by complementing $X_1, X_2, \ldots$ and $X_m$, $(Y_1Y_2 \ldots Y_n)$ is the decimal number corresponding to the binary number resulting from complementing $Y_1, Y_2, \ldots$ and $Y_n$, and P and Q are constants.

According to yet other principles of the invention, the analog-to-digital converter is designed such that the comparator indicates a balance condition when the following equation is satisfied:

$$(e+V)P^{-(X_1X_2 \ldots X_m)} - Q(S + (Y_1Y_2 \ldots Y_n)) = 0$$

where S is a constant.

BRIEF DESCRIPTION OF THE DRAWINGS

The foregoing and other objects, features, and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 1 is a graph showing the relationship between the analog and digital signals in a standard fifteen-segment approximation to the $\mu 255$ 'law;

FIG. 2 is a schematic demonstrating the bit assignment in an eight bit code representing the digital signals of FIG. 1;

FIG. 3 is a circuit diagram showing a preferred embodiment of the digital-to-analog decoder of the present invention;

FIG. 4 is a circuit diagram embodying the analog-to-digital encoder of the present invention.

DESCRIPTION OF PREFERRED EMBODIMENTS OF THE INVENTION

Referring again to FIG. 2, the converter of the present invention has been designed to encode and decode an eight bit code word including a sign bit 24, three segment bits A, B and C and four step bits D, E, F and G. For purposes of explanation, any combination of these letters in parenthesis is defined as the decimal number corresponding to the binary number which is obtained by complementing those bits. For example, where the values of bits A, B and C are 1, 0 and 1, respectively, the binary number obtained by complementing A, B and C is 010 and the decimal number corresponding to that binary number is 2. By reference to the CCITT recommendations it can be seen that the series of values for (ABCDEFG) form a counting sequence corresponding to the decision values, or step numbers. In the CCITT recommendations the code word for an analog value of zero is 11111111 or 01111111 and the subsequent code words can be seen as a count down to 10000000 or 00000000 for the highest values of positive and negative signals, respectively. If, for example, the positive code went from 10000000 at zero to 11111111 at the highest value, it would not be necessary to complement the bits.

I have found that the value of the decoder output is a function of the decision number expressed as described above. The function is determined by the following equation:

$$e = 2^{(ABC)}(33 + 2 \text{ DEFG}) - 33 \qquad (1)$$

where e is the absolute value of the desired output in arbitrary units. The additive numbers in the equation are in the same arbitrary units. The actual output of the decoder will be determined by the unit selected; the unit simply sets the range of output values.

FIG. 3 shows a digital-to-analog converter for decoding the eight bit code of FIG. 2. The analog output e of the circuit can be solved in terms of a number of switch positions and it will be shown that the solution of the circuit equation is identical to equation (1).

The digital-to-analog converter includes an amplifier 40 having an inverting input 41 and noninverting input 42 connected to a ground potential. As analog signal output e is taken from the output line 43 of the amplifier. A feedback circuit from the output line 43 to the input 41 includes an attenuator 44. This attenuator is referenced through a line 46 to a voltage reference source 48. The voltage reference source provides a plus or minus 33 unit reference voltage to the line 46 with respect to ground potential on the line 50. The sign of the reference voltage is determined through internal logic means responsive to a signal 52 determined by the value of the sign bit 24 in the input digital code word. A current source or sink 54 is connected between the amplifier input 41 and the reference line 46.

The attenuator 44 is similar to that shown in my prior patent and includes a resistor 56 of an arbitrary unit resistance R and three stages corresponding to respective code bits A, B and C. The attenuator stage corresponding to bit A includes a first resistor 58 in series with the resistor 56 and a second resistor 60 connected to the reference potential line 46. The resistance values of the resistors 58 and 60 are 15R and 16R/15, respectively. By means of a switch 62 the stage may be inserted into or removed from the attenuator circuit 44. In the position shown, the resistor 58 is bypassed and resistor 60 is in an open circuit. The position shown corresponds to a 1 value in the A bit and disconnects the stage from the attenuator. With the switch as shown, the output resistance of the stage is simply the resistance R of resistor 56.

With a zero value in the A bit, the switch 62 moves to its alternate position and the resistors 58 and 60 are included in the attenuator. In that case, the resistors 56, 58 and 60 form a voltage divider which attenuates the signal thereacross by 1/16th for an attenuation factor of 16. The output resistance of stage A is still R, the value of the resistor 60 in parallel with the resistors 56 and 58. Thus, because the output resistance does not change, the operation of subsequent stages in the attenuator will not be affected by the position of switch 62.

The second stage corresponds to bit B and includes resistors 64 and 66 and a switch 68. Resistor 64 has a value of 3 R and is bypassed by switch 68 when bit B has a value of 1. Resistor 66, having a value of 4R/3, is in an open circuit with a B bit value of 1. In the switch position shown, the output resistance of the B stage is the output resistance R of the A stage. With a 0 in the B bit the output resistance of the B stage is that of resistor 66 in parallel with resistor 64 and the output resistance R of the A stage; the resultant output resistance is still R.

With the switch 68 in its 0 position, the B stage comprises a voltage divider including the output resistance R of the A stage and resistors 64 and 66. The resultant attenuation factor of stage B is 4.

Stage C includes two resistors 70 and 72 and a switch 74 connected as in the prior stages. Resistor 70 has a value of R and resistor 72 has a value of 2 R resulting in an output resistance of R and an attenuation factor of 2.

Because the output voltage of each stage is not affected by the position of the switches 60, 66 and 72, the factors of the attenuator 44 may be independently manipulated without having an effect on any other stage.

Because each stage of the attenuator attenuates the signal in turn, the attenuations combine multiplicatively. If each stage were connected into the attenuator 44, stage A would give an attenuation of 1/16 or $2^{-4}$, stage B would give an attenuation of ¼ or $2^{-2}$, and stage C would give an attenuation of ½ or $2^{-1}$. These attenuations would combine multiplicatively resulting in an overall attenuation of $2^{-(4+2+1)}$ which is an attenuation of $2^{-(ABC)}$ where A=0, B=0, and C=0. It can be seen that the attenuation of $2^{-(ABC)}$ holds true for all values of (ABC). Thus the attenuation factors are weighted nonlinearly with respect to ABC.

When sign bit 24 indicates a positive analog signal, the reference voltage V on line 46 is a minus 33 units; and when a negative analog output is indicated the voltage reference is plus 33 units. The absolute value of the voltage across the multiplicative ladder 44 is thus the sum of the absolute value of the analog output e and the absolute value of the reference voltage V. Thus the open circuit output voltage W of the ladder, with respect to the reference voltage, is:

$$W = (e+33) 2^{-(ABC)} \quad (2)$$

Translating the measurement point from the reference potential to ground potential, the output voltage of the multiplicative ladder, with respect to common, is:

$$W = (e+33) 2^{-(ABC)} - 33 \quad (3)$$

With an output resistance of R, the output current I of the multiplicative ladder is the open circuit output voltage divided by R or:

$$I = ((e+33) 2^{-(ABC)} - 33)/R \quad (4)$$

The positive input to the op-amp is connected to ground and the op-amp 40 tends to drive the attenuator ladder to a condition where the attenuator output current is 0. Hence, where the current source or sink is disconnected from the input line 41 the current equation (4) reduces to the equation:

$$(e+33) 2^{-(ABC)} - 33 = 0 \quad (5)$$

For the eight values of (ABC) the solution of equation (5) for the analog output e gives the following respective analog outputs:

0, 33, 99, 231, 495, 1023, 2079, and 4191.
By reference to the CCITT recommendations it can be seen that these outputs are the beginning values of each of the μ255 segments.

Referring again to FIG. 3, the current source or sink 54 is a resistor ladder including four stages, each of which corresponds to a bit D, E, F or G. A resistor 80 having a value of 2R is connected from the last stage G to ground. Stage G comprises a resistor 82 of resistance 2R and a switch 84 shown in the position corresponding to a 1 value for the G bit. The F stage comprises a resistor 86 of a resistance 2R and a switch 88 shown in the 1 value position. A resistor 90 of resistance R separates stages F and G. Similarly, the E stage comprises a resistor 92 and a switch 94 separated from the F stage by a resistor 96, and the D stage comprises a resistor 98 and a switch 100 separated from the E stage by a resistor 102. An input resistor 104 determines the current flow through the ladder.

Referring again to stage G, its input resistance is determined by resistors 82 and 80 in parallel, or 2R in parallel with 2R for an input resistance of R. The input resistance of stage F is the resistance of the resistor 86 in parallel with the resistor 90 in series with stage G. Thus, stage F also has an input resistance of R. Similarly, each stage of the current source or sink ladder has an input resistance of R.

Each stage of the ladder to connected to ground when its respective switch is in the 1 value position shown. With a bit value of 0 a respective switch connects a stage to the input 41 to the op-amp 40. Since the op-amp tends to drive its input voltage to zero, and each stage is connected either to input 41 or to ground potential on line 42, the same amount of current is drawn through each stage independent of the switch positions.

The total ladder current is the current drawn across a resistance of R in series with the resistor 104 by a voltage of plus or minus 33 units. The resistor 104 has a resistance of R/32. Using Ohms law, the total current through the ladder equals 32/R units. Looking into stage D of the resistive ladder the current sees a resistance of 2R is drawn through the resistor 98. If switch 100 is in the position shown, this current has no effect on the output voltage e. However, if switch 100 is placed in the alternate position with a 0 value at bit D, a current of 16/R is drawn from or driven to the line 41. Of the 16/R units of current through the resistor 102, half or 8/R units, is drawn from or driven into lines 41 and 42 through the resistor 92 of stage E. Similarily, 4/R units of current pass through stage F and 2/R units pass through stage G. The total current delivered to the line 41 is thus 2 (DEFG)/R units, or more generally (DEFG) Q where Q is a constant. Using the constant Q, the current levels or factors of the four stages are:

8Q, 4Q, 2Q and Q.

Thus the current factors are linearly weighted with respect to DEFG.

When the op-amp has brought the circuit to balance, the current 2(DEFG)/R is the output current of the attenuator in equation 4. Equating these currents yields the equation:

$$2(DEFG)/R = ((e+33) 2^{-(ABC)} - 33)/R \quad (6)$$

which reduces to:

$$(e+33) 2^{-(ABC)} - 2(16 + (DEFG)) - 1 = 0 \quad (7)$$

The analog output voltage e can be solved from equation (7) and this solution is identical to equation (1). Thus the values of the analog output signal e produced by the circuit of FIG. 3, with the ladder switches and voltage reference set in accordance with the corresponding bits of the input digital signal, are the exact μ255 output expansion.

Several variations may be made in the circuit of FIG. 3. For example, the voltage reference 48 may be a reference controlled by the sign bit as shown or it may be a single value reference with the analog output e being applied to a switched signal inverter.

The resistor 104 may be omitted and its resistance incorporated into one of the ladders since it only acts to scale the ratio of currents between the two ladders. Hence, in practice, by scaling the current ladder resistors up by a factor of 33/32, or by scaling the multiplicative ladder down by the same amount, resistor 104 is no longer required.

Each of the switches in the circuit preferably comprises two field effect transistors (FETs) controlled by logic circuitry as shown in my prior U.S. Pat. No. 3,882,484. The finite resistances of these switches have not been accounted for in the description thus far. The resistances of the switches in the vertical branches can be compensated for by reducing the resistances of resistors in the branches by amounts equal to the switch resistances, or alternatively, the switch resistances can be made intentionally high so as to replace the function of resistor 104.

The switches paralleling resistors 58, 64, and 70 can be accommodated by selecting the resistor magnitudes so that the resistance increases at successive nodes in the multiplicative section. Resistor 56 can be reduced by three switch resistances, approximately; the output impedance of the 56, 58, 60 combination can be reduced by approximately two switch resistances; and the output impedance of the 64, 66 and prior network combination can be reduced by approximately one switch resistance to result in the same net output impedance to the current ladder. By readjusting the desired impedance at each node to include the cumulative switch resistance the nominal switching ratio can be retained with no undesired interaction between multiplicative bits.

A more general description of the digital-to-analog converter can be made by defining an m number of segment bits as $X_1, X_2, \ldots$ and $X_m$ and an n number of step bits as $Y_1, Y_2, \ldots$ and $Y_n$. Equation (1), the solution to the circuit equation, can then be generalized for a digital-to-analog converter of m attenuator stages and n current source or sink stages:

$$e32p^{(X1X2\ldots Xm)}(V+Q(Y_1Y_2\ldots Yn))-V$$

Where P and Q are constants.

The analog-to-digital encoder shown in FIG. 4 includes attenuator and current source or sink elements similar to those in the digital-to-analog converter. An analog input signal e applied to line 120 passes through an attenuator 122 to the input 124 of a comparator 126. The other input to the comparator 128 is connected to a decision point reference voltage which in this case is ground potential. Also connected to the input 124 of the comparator 126 is a current source or sink 130.

The output 132 from the comparator is applied to control logic 134. The control logic is responsive to the polarity of the comparator output to control the positions of the various ladder switches through switch control 136 and to provide a digital indication of the switch positions through output buffers 138. A voltage reference source 140 is responsive to a signal from the control logic circuit 134 to provide a reference voltage V of plus or minus 33 units. The attenuator 122 and the current source or sink 130 are referenced through line 142 to the voltage of the reference source 140.

In order to offset the comparator input 124 by one unit, an inverter 144 in circuit with resistors 146, 148 and 150 is connected between the line 142 and the comparator input 124.

The attenuator 122 and current source or sink 130 are identical to those used in the digital-to-analog converter already described. Ignoring for the time being the effect of inverter 144 and its related circuitry, the operation of the circuit is as follows. With all bits in the position shown, that is with all bits at 1 values, the comparator 126 and logic circuitry 134 determine the sign of the input signal. This information is stored in the control logic 134 and used to control the polarity of the reference potential on line 142. For a positive analog signal the reference voltage is negative and for a negative signal the reference is positive.

A counter in the control logic circuitry 134 drives the switches through each step from one end of the scale to the other. The comparator 126 then indicates when the output crosses through the zero point. The positions of the switches at the zero crossing roughly indicate the PCM $\mu$ law code.

The above operation does not exactly correspond to the $\mu 255$ encoding law. A discrepancy arises because in the code the first step of the first segment is only half the size of the remaining steps of the segment. This half-step offset centers the code transitions between steps of the decoder output functions. In order to account for that half-step offset, the inverting circuit including inverter 144 is provided. The inversion circuit applies one unit of current of a polarity opposite to that of the current source or sink 130 to the input 124 of comparator 126. With this modification of the analog-to-digital encoder the condition for balance of the encoder circuit can be expresses as a modification of equation (7):

$$(e+33)2^{-(ABC)}-2(16+(\text{DEFG}))=0 \tag{8}$$

Using the same generalization scheme set forth for the digital-to-analog converter, an analog-to-digital converter circuit in accordance with the present invention having m attenuator stages and n current source or sink stages will be in balance when the following equation is satisfied:

$$(e+V)P^{-(X1X2\ldots X_m)}-Q(S+(Y_1Y_2\ldots Yn))=0$$

where P, Q and S are constants.

Rather than using the resistor 146 at the input to inverter 144, the current input to the inverter might be taken from resistor 152 with an appropriate scaling of resistors 148 and 150 so that a current equal to half the current in resistor 152 would drive the comparator input 124.

As another means for providing the one unit offset, a unit voltage taken from the reference 140 can be used to drive a voltage follower connected to the input 128 of the comparator 126. The line 156 to ground would be broken at the point xx. If the resistor 154 is then eliminated and shorted, the converter will then closely approximate equation (8).

Although it has been suggested that a counter simply run the ladder switches through a binary count which stops at the zero crossing, a more rapid conversion may be provided by using more elaborate control logic to execute a successive approximation routine as is known in the art.

While the invention has been particularly shown and described with reference to a preferred embodiment thereof, it will be understood by those skilled in the art that various changes in form and details may be made therein without departing from the spirit and scope of the invention as defined by the appended claims.

I claim:

1. A digital-to-analog converter for converting a digital number comprising a first set of step bits and a second set of segment bits to a corresponding analog signal, said converter including:
   a current source or sink comprising a resistor ladder network having an input and an output, said network including a plurality of stages each having a series resistor and a shunt resistor;
   an amplifier having one input connected to the output of said ladder network;
   a source of reference voltage connected to the input of said ladder network;
   a plurality of first switches directly responsive to said step bits respectively for switching the currents of corresponding stages of said ladder network into or out of the ladder output, providing a step-wise output from said ladder into said amplifier input;
   an attenuator network comprising a plurality of serially-connected stages;
   a plurality of second switches directly responsive respectively to said segment bits, each of said second switches controlling a corresponding stage of said attenuator network to connect it into or out of the attenuator network, the degree of attenuation provided by said attenuator network being a multiplicative function of the individual attenuation factors of the stages thereof which are connected in the attenuator network by the corresponding switches of said network, each stage of said attenuator network being individually manipulatable by its corresponding switch without having any effect on the attenuation factor introduced by any other attenuator stage, said attenuation factors being weighted non-linearly with respect to said segment bits; and
   circuit means interconnecting said attenuator network in a negative feedback circuit between the output and input of said amplifier, said circuit means including means for producing a composite output signal from said amplifier representing the multiplication of said ladder output, as controlled by said step bits, by a factor corresponding to the net attenuation effected by said attenuator network as controlled by said individual segment bits.

2. A digital-to-analog converter as claimed in claim 1, wherein the output impedance of said attenuator network is equal to the input impedance of said ladder network.

3. A digital-to-analog converter as claimed in claim 1, wherein said amplifier has a pair of input terminals;
   each of said ladder switches including means to divert the current of a corresponding ladder stage alternatively to either of said pair of input terminals; and
   said reference source having a common terminal connected to a preselected one of said amplifier input terminals and a reference voltage terminal connected to the input of said ladder network.

4. A digital-to-analog converter as claimed in claim 1, wherein said amplifier has a pair of input terminals;
   each of said first switches being connected in a corresponding shunt leg to divert the current thereof alternatively to one or the other of said amplifier input terminals;
   said one terminal serving as a common ground terminal;
   said negative feedback means maintaining said two terminals at the same potential;
   whereby said switches operate at essentially ground potential.

5. An analog-to-digital converter comprising:
   comparator means for comparing a comparator input with a decision point voltage, and for giving a digital output dependent on the magnitude of the comparator input relative to the decision point voltage, wherein said digital output comprises a set of step bits and a set of segment bits;
   means for establishing a reference potential;
   attenuation means coupled to the input of said comparator means, said attenuator means comprising a plurality of substantially independent stages, each assigned a respective one of a plurality of attenuation factors, and means for switching each of said stages into or out of said attenuator means to multiplicatively contribute or withhold the attenuation factor assigned to said stage to or from the attenuation level of said attenuator, the attenuation factors being nonlinearly weighted with respect to said segment bits of said digital output signal, each stage of said attenuator means being individually operable without affecting any other attenuator stage;
   a current source or sink comprising a plurality of substantially independent stages, each assigned a respective one of a plurality of current factors, and means for switching each of said stages into and out of said current source or sink to additively contribute or withhold the current factor assigned to said stage to or from the current source or sink, said current factors being linearly weighted with respect to said step bits of said digital output signal;
   logic means responsive to the polarity of the comparator output and including means for producing the sets of segment bits and step bits for operating the switch means of said attenuator means and said current source or sink respectively for successively adjusting the attenuation of said attenuator means and the current level of said source or sink;
   output means for giving a digital output signal indicative of the attenuation level and the current level;
   said attenuation means further comprising three stages having respective attenuation factors of sixteen, four and two and wherein said current source or sink comprises four stages having respective current levels of 8Q, 4Q, 2Q and Q, where Q is a predetermined constant.

6. An analog-to-digital converter comprising:
   comparator means for comparing a comparator input with a decision point voltage, and for giving a digital output dependent on the magnitude of the comparator input relative to the decision point voltage, wherein said digital output comprises a set of step bits and a set of segment bits;
   said comparator means having a pair of input terminals;
   means for establishing a reference potential V;
   attenuation means coupled to the input of said comparator means, said attenuator means comprising a plurality of substantially independent stages, each assigned a respective one of a plurality of attenuation factors, and means for switching each of said stages into or out of said attenuator means to multiplicatively contribute or withhold the attenuation factor assigned to said stage to or from the attenuation level of said attenuator, the attenuation factor being nonlinearly weighted with respect to said segment bits of said digital output signal, each stage of said attenuator means being individually operable without affecting any other attenuator stage;

a current source or sink comprising a plurality of substantially independent stages, each assigned a respective one of a plurality of current factors, and means for switching each of said stages into and out of said current source or sink to additively contribute or withhold the current factor assigned to said stage to or from the current source or sink, said current factors being linearly weighted with respect to said step bits of said digital output signal;

said current source or sink comprising a resistor network providing said plurality of stages for developing said linearly weighted current factors;

means connecting said reference potential to one end of said resistor network to produce current therethrough for all of said plurality of stages;

said switching means for said current source or sink comprising a set of switches each connected to a corresponding one of said stages and operable by a corresponding step bit to divert the current in said stage alternatively to one or the other of said comparator input terminals;

logic means responsive to the polarity of the comparator output and including means for producing the sets of segment bits and step bits for operating the switch means of said attenuator means and said current source or sink respectively for successively adjusting the attenuation of said attenuator means and the current level of said current source or sink; and output means for giving a digital output signal indicative of the attenuation level and the current level.

7. An analog-to-digital converter comprising:

comparator means for comparing a comparator input with a decision point voltage, and for giving a digital output dependent on the magnitude of the comparator input relative to the decision point voltage, wherein said digital output comprises a set of step bits and a set of segment bits;

means for establishing a reference potential;

attenuation means coupled to the input of said comparator means, said attenuator means comprising a plurality of substantially independent stages, each assigned a respective one of a plurality of attenuation factors, and means for switching each of said stages into or out of said attenuator means to multiplicatively contribute or withhold the attenuation factor assigned to said stage to or from the attenuation level of said attenuator, the attenuation factors being nonlinearly weighted with respect to said segment bits of said digital output signal, each stage of said attenuator means being individually operable without affecting any other attenuator stage;

a current source or sink comprising a plurality of substantially independent stages, each assigned a respective one of a plurality of current factors, and means for switching each of said stages into and out of said current source or sink to additively contribute or withhold the current factor assigned to said stage or from the current source or sink, said current factors being linearly weighted with respect to said step bits of said digital output signal;

logic means responsive to the polarity of the comparator output and including means for producing the sets of segment bits and step bits for operating the switch means of said attenuator means and said current source or sink respectively for successively adjusting the attenuation of said attenuator means and the current level of said current source or sink;

output means for giving a digital output signal indicative of the attenuation level and the current level;

said means for establishing a reference potential further including logic means for establishing a negative reference voltage V when said analog input e is positive and for establishing a positive reference voltage V when said analog input e is negative;

offset means for producing for said comparator means a one-unit offset having a polarity opposite to that of said reference voltage; and said analog-to-digital converter providing a seven-bit digital code having bits A, B, C, D, E, F and G, and a sign bit, each of the stages of the attenuator being switched into or out of the attenuator in accordance with the binary value of a respective bit A, B or C and each stage of the current source or sink being switched into or out of the current source or sink in accordance with the value of a respective bit D, E, F or G, the values of circuit elements in each of said stages being set such that the balance condition of the circuit for an input analog voltage e is determined by the equation:

$$(e+V)2^{-(ABC)} - 2(16 + (DEFG)) = 0$$

where e is the analog input in arbitrary units, (ABC) is the decimal number corresponding to the binary number ABC and (DEFG) is the decimal number corresponding to the binary number DEFG.

8. An analog-to-digital converter comprising:

comparator means for comparing a comparator input with a decision point voltage, and for giving a digital output dependent on the magnitude of the comparator input relative to the decision point voltage, wherein said digital output comprises a set of step bits and a set of segment bits;

means for establishing a reference potential V;

attenuation means coupled to the input of said comparator means, said attenuator means comprising a plurality of substantially independent stages, each assigned a respective one of a plurality of attenuation factors, and means for switching each of said stages into or out of said attenuator means to multiplicatively contribute or withhold the attenuation factor assigned to said stage to or from the attenuation level of said attenuator, the attenuation factor being nonlinearly weighted with respect to said segment bits of said digital output signal, each stage of said attenuator means being individually operable without affecting any other attenuator stage;

a current source or sink coupled to the input of said comparator means and comprising a plurality of substantially independent stages, each assigned a respective one of a plurality of current factors, and means for switching each of said stages into and out of said current source or sink to additively contribute or withhold the current factor assigned to said stage to or from the current source or sink, said current factors being linearly weighted with respect to said step bits of said digital output signal;

means coupling said reference potential to said current source or sink;

logic means responsive to the polarity of the comparator output and including means for producing the sets of segment bits and step bits for operating the switch means of said attenuator means and said current source or sink respectively for successively adjusting the attenuation of said attenuator means and the current level of said current source or sink;

output means for giving a digital output signal indicative of the attenuation level and the current level;

said converter providing a digital code having bits $X1, X2, \ldots$ and $X_m; Y_1, Y_2, \ldots$ and $Y_n$, each of the stages of the attenuator being switched into or out of the attenuator in accordance with the binary value of a respective bit $X_1, X_2 \ldots$ or $X_m$ and each stage of the current source or sink being switched into or out of the current source or sink in accordance with the binary value of a respective bit $Y_1, Y_2, \ldots$ or $Y_n$, values of circuit elements in each of said stages being set such that the balance condition of the circuit for an input analog voltage e is determined by the equation:

$$(e+V)P^{-(X_1X_2\ldots X_m)} - Q(S+(Y_1Y_2\ldots Y_n)) = 0$$

where e is the analog input in arbitrary units, $(X_1X_2 \ldots X_m)$ is the decimal number corresponding to the binary number $X_1X_2 \ldots X_m$, $(Y_1Y_2 \ldots Y_n)$ is the decimal number corresponding to the binary number $Y_1Y_2 \ldots Y_n$, and P, Q and S are predetermined constants;

said reference potential being established to have a polarity opposite to said analog input e; and offset means for developing said digital output signal with an effective offset corresponding to one-half of one of said step bits.

9. Apparatus as claimed in claim 8, including logic means for developing a sign bit for the digital output signal and for causing said reference potential to be negative when the analog input e is positive and for causing said reference potential to be positive when the analog input e is negative.

10. An analog-to-digital converter comprising:

comparator means for comparing a comparator input with a decision point voltage, and for giving a digital output dependent on the magnitude of the comparator input relative to the decision point voltage, wherein said digital output comprises a set of step bits and a set of segment bits;

means for establishing a reference potential V;

attenuation means coupled to the input of said comparator means, said attenuator means comprising a plurality of substantially independent stages, each assigned a respective one of a plurality of attenuation factors, and means for switching each of said stages into or out of said attenuator means to multiplicatively contribute or withhold the attenuation factor assigned to said stage to or from the attenuation level of said attenuator, the attenuation factor being nonlinearly weighted with respect to said segment bits of said digital output signal, each stage of said attenuator means being individually operable without affecting any other attenuator stage;

a current source or sink comprising a plurality of substantially independent stages, each assigned a respective one of a plurality of current factors, and means for switching each of said stages into and out of said current source or sink to additively contribute or withhold the current factor assigned to said stage to or from the current source or sink, said current factors being linearly weighted with respect to said logic means responsive to the polarity of the comparator output and including means for producing the sets of segment bits and step bits for operating the switch means of said attenuator means and said current source or sink respectively for successively adjusting the attenuation of said attenuator means and the current level of said current source or sink;

output means for giving a digital output signal indicative of the attenuation level and the current level;

said converter providing a digital code having bits $X1, X2, \ldots X_m; Y_1, Y_2, \ldots$ and $Y_n$, each of the stages of the attenuator being switched into or out of the attenuator in accordance with the binary value of a respective bit $X_1, X_2 \ldots$ or $X_m$ and each stage of the current source or sink being switched into or out of the current source or sink in accordance with the binary value of a respective bit $Y_1, Y_2, \ldots$ or $Y_n$, values of circuit elements in each of said stages being set such that the balance condition of the circuit for an input analog voltage e is determined by the equation:

$$(e+V)P^{-(X_1X_2\ldots X_m)} - Q(S+(Y_1Y_2\ldots Y_n)) = 0$$

where e is the analog input in arbitrary units, $(X_1X_2 \ldots X_m)$ is the decimal number corresponding to the binary number $X_1X_2 \ldots X_m$, $(Y_1Y_2 \ldots Y_n)$ is the decimal number corresponding to the binary number $Y_1Y_2 \ldots Y_n$, and P, Q and S are predetermined constants;

said digital signal further including a sign bit and said means for establishing a reference potential including logic means for establishing a negative reference voltage V when said analog input e is positive and for establishing a positive reference voltage V when said analog input e is negative; and offset means for producing for said comparator means a one-unit offset having a polarity opposite to that of said reference voltage.

11. An analog-to-digital converter comprising:

comparator means for comparing a comparator input with a decision point voltage, and for giving a digital output dependent on the magnitude of the comparator input relative to the decision point voltage, wherein said digital output comprises a set of step bits and a set of segment bits;

said comparator means having a pair of input terminals;

means for establishing a reference potential V;

input terminal means to receive an analog input signal e;

attenuation means having an input circuit and an output circuit, said attenuation means comprising a plurality of substantially independent stages, each assigned a respective one of a plurality of attenuation factors, and means for switching each of said stages into or out of said attenuator means to multiplicatively contribute or withhold the attenuation factor assigned to said stage to or from the attenuation level of said attenuator, the attenuation factor being nonlinearly weighted with respect to said segment bits of said digital output signal, each stage of said attenuator means being individually operable without affecting any other attenuator stage;

a current source or sink having an input circuit and an output circuit and comprising a plurality of substantially independent stages, each assigned a respective one of a plurality of current factors, and means for switching each of said stages into and out of said current source or sink to additively contribute or withhold the current factor assigned to said stage to or from the current source or sink, said current factors being linearly weighted with respect to said step bits of said digital output signal;

means connecting the input circuit of said attenuation means to said input terminal means to apply said analog signal e directly to the input of the multiplicative attenuator;

means connecting said reference potential V to the input circuit of said current source or sink;

means connecting both the output of said attenuation means and the output of said current source or sink to the input of said comparator means;

logic means responsive to the polarity of the comparator output and including means for producing the sets of segment bits and step bits for operating the switch means of said attenuator means and said current source or sink respectively for successively adjusting the attenuation of said attenuator means and the current level of said current source or sink;

output means for giving a digital output signal indicative of the attenuation elvel and the current level;

said converter providing a digital code having bits $X_1, X_2, \ldots X_m; Y_1, Y_2, \ldots$ and $Y_n$, each of the stages of the attenuator being switched into or out of the attenuator in accordance with the binary value of a respective bit $X_1, X_2 \ldots$ or $X_m$ and each stage of the current source or sink being switched into or out of the current source or sink in accordance with the binary value of a respective bit $Y_1, Y_2, \ldots$ or $Y_n$, values of circuit elements in each of said stages being set such that the balance condition of the circuit for an input analog voltage e is determined by the equation:

$$(e+V)P^{-(X_1X_2\ldots X_m)} - Q(S+(Y_1Y_2\ldots Y_n)) = 0$$

where e is the analog input in arbitrary units, $(X_1X_2 \ldots X_m)$ is the decimal number corresponding to the binary number $X_1X_2 \ldots X_m$, $(Y_1Y_2 \ldots Y_n)$ is the decimal number corresponding to the binary number $Y_1Y_2 \ldots Y_n$, and P, Q and S are predetermined constants.

* * * * *